United States Patent
Hausmann

[19]

[11] Patent Number: 6,163,448
[45] Date of Patent: *Dec. 19, 2000

[54] APPARATUS AND METHOD FOR EX-SITU TESTING OF PERFORMANCE PARAMETERS ON AN ELECTROSTATIC CHUCK

[75] Inventor: Gilbert Hausmann, Ben Lomond, Calif.

[73] Assignee: Applied Materials, Inc., Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/126,885

[22] Filed: Jul. 31, 1998

[51] Int. Cl.[7] .................................................. H01G 23/00
[52] U.S. Cl. ............................................................ 361/234
[58] Field of Search .................................... 361/230, 235, 361/234; 279/128; 324/75, 457

[56] References Cited

U.S. PATENT DOCUMENTS

| | | |
|---|---|---|
| 3,443,224 | 5/1969 | Kraemer et al. ........................... 324/72 |
| 3,887,877 | 6/1975 | Vosteen ..................................... 324/72 |
| 4,724,393 | 2/1988 | Kumada et al. ........................... 324/72 |
| 5,117,121 | 5/1992 | Watanabe et al. ....................... 307/130 |
| 5,463,526 | 10/1995 | Mundt ..................................... 361/234 |
| 5,917,327 | 6/1999 | Haley et al. ............................. 361/234 |

*Primary Examiner*—Stephen W. Jackson
*Attorney, Agent, or Firm*—Thomason, Moser & Patterson

[57] ABSTRACT

An apparatus and method for ex-situ measurement of electrostatic chuck performance parameters and correlating ex-situ measurements to in-situ chuck performance. The apparatus comprises a probe, a fixture, a data acquisition system and a controller. The fixture secures a probe head in a substantially fixed position relative to the chuck. The apparatus coordinates measurements of the chuck surface potential as a function of time with the voltage applied to the chuck electrodes. The method comprises fixing the chuck and probe head to the fixture, measuring an ex-situ performance parameter of the chuck, such as surface potential, and comparing the measured parameter to a predetermined in-situ performance profile. The ex-situ performance parameter measurement can be measured as a function of time and/or coordinated with a change in the voltage applied to the chuck electrodes. By comparing the measured parameter to an ideal in-situ performance profile, the ex-situ measurement serves as a predictor of in-situ chuck behavior.

23 Claims, 4 Drawing Sheets

APPARATUS AND METHOD FOR EX-SITU TESTING OF PERFORMANCE PARAMETERS ON AN ELECTROSTATIC CHUCK

BACKGROUND OF THE DISCLOSURE

1. Field of the Invention

The invention relates to electrostatic chucks and, more particularly, the invention relates to ex-situ measurement of surface potential.

2. Description of the Background Art

Electrostatic chucks are used for holding a workpiece in various applications ranging from holding a sheet of paper in a computer graphics plotter to holding a semiconductor wafer within a semiconductor wafer process chamber. In semiconductor wafer processing equipment, electrostatic chucks are used for clamping wafers to a pedestal during processing. These chucks find use in etching, chemical vapor deposition (CVD), and physical vapor deposition (PVD) applications.

Electrostatic chucks secure a workpiece by creating an electrostatic attractive force between the workpiece and the chuck. A voltage is applied to one or more electrodes in the chuck so as to induce opposite polarity charges in the workpiece and electrodes, respectively. The opposite charges pull the workpiece against the chuck, thereby retaining the workpiece. For example, in a "monopolar" electrostatic chuck, voltage is applied to a conductive chuck electrode relative to some ground reference. Electrostatic force is established between the workpiece being clamped and the electrostatic chuck. When the voltage is applied, the workpiece is referred back to the same ground reference as the voltage source by a conductive connection to the wafer. A "bipolar" electrostatic chuck generally contains two electrodes embedded within a unitary ceramic chuck body. The ceramic chuck body is, for example, fabricated of aluminum nitride, boron nitride or alumina doped with a metal oxide such as titanium oxide or chromium oxide or some other ceramic material with similar resistive properties. These types of ceramics are partially conductive (relatively low resistivity) at high temperatures. Because of the conductive nature of the ceramic material, the workpiece is primarily retained against the upper surface of the chuck body by the Johnsen-Rahbek effect. Johnsen-Rahbek chucks are disclosed in U.S. Pat. No. 5,117,121, issued May 26, 1992 and U.S. Pat. No. 5,463,526 issued Oct. 31, 1995.

The performance (i.e., chucking force) of a given electrostatic chuck changes over time. For example, some chucks exhibit a degradation of the chucking force over time after a chucking voltage has been applied to the chuck electrodes. This is believed to be due to the existence of low mobility charge carriers in the bulk material of the chuck. Other chucks exhibit a transient repelling force when the chucking voltage is turned off. This is due to repulsion of residual charges on the wafer backside by charges of like polarity induced on the chuck electrodes by a transient overpotential on the chuck electrodes when the chuck is turned off.

The behavior of the chuck varies from chuck to chuck in an unpredictable fashion. However, the performance of an electrostatic chuck can generally be measured by a performance parameter such as electrostatic surface potential on the upper surface of the chuck. The surface potential is directly proportional to the chucking force that actually attracts the workpiece.

In the prior art, hand held electrostatic probes and meters have been used to measure the surface potential of electrostatic chucks in-situ (i.e., in the process chamber). Unfortunately, such measurements are not considered reliable indicators of chuck performance. Reliable measurements of the surface potential require that an electrostatic probe be kept at a fixed distance from the chuck surface. In addition, the probe must be held at the same location on the chuck surface in order to compare measurements of the surface potential taken over time or to compare measurements taken on different chucks. Finally, it is difficult to coordinate hand held probe measurements with the timing of the voltages applied to the chuck electrodes.

Therefore, a need exists in the art for an apparatus and method for reliable measurement of electrostatic chuck performance parameters and correlating those measurements to in-situ chuck performance.

SUMMARY OF THE INVENTION

The disadvantages associated with the prior art are overcome by the present invention of an apparatus and method for ex-situ measurement of electrostatic chuck performance parameters and correlating those ex-situ measurements to in-situ chuck performance. The apparatus is located ex-situ (i.e., outside the chamber environment) so that an electrostatic chuck can be tested under controlled conditions. The apparatus comprises a probe, a fixture, a data acquisition system and a controller. The fixture secures a probe head in a substantially fixed position relative to the chuck. The probe head measures an ex-situ performance parameter such as a chuck surface potential. The data acquisition system receives analog surface potential measurements from the probe head (or a meter coupled to the probe head) and sends them to the controller for processing and storage. A switching device couples a chuck power supply to the data acquisition system. The controller controls the voltage applied to the chuck electrodes in accordance with a predetermined test routine. The testing apparatus coordinates measurements of the chuck surface potential as a function of time with the voltage applied to the chuck electrodes.

The above apparatus can be used to implement a method of the present invention. The method comprises fixing the chuck and probe head to the fixture, measuring an ex-situ performance parameter of the chuck and comparing the measured parameter to a predetermined in-situ performance profile. The ex-situ performance parameter (e.g. surface potential) can be measured as a function of time and/or coordinated with a change in the voltage applied to the chuck electrodes. By comparing the measured parameter to an ideal in-situ performance profile, the ex-situ measurement serves as a predictor of in-situ chuck behavior. Alternatively, the measured ex-situ performance parameter can be used for quality control or failure analysis purposes.

BRIEF DESCRIPTION OF THE DRAWINGS

The teachings of the present invention can be readily understood by considering the following detailed description in conjunction with the accompanying drawings, in which.

DETAILED DESCRIPTION

Figure 1:
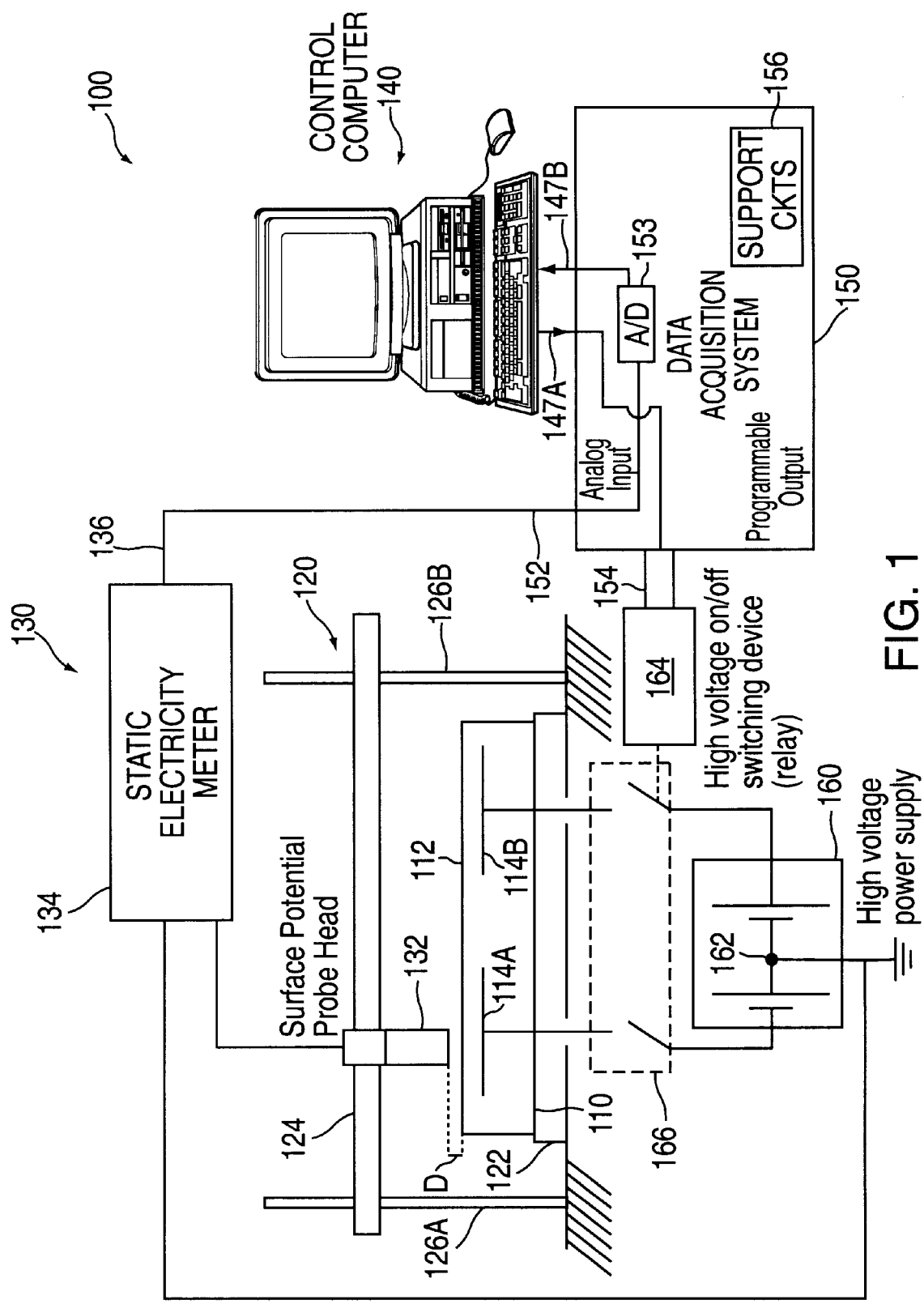
FIG. 1 depicts a schematic of the ex-situ measurement apparatus of the present invention.

A measurement apparatus 100 of the present invention is depicted in FIG. 1. The apparatus 100 is located ex-situ (i.e., outside a process chamber) for measurement of one or more performance parameters of an electrostatic chuck 110. The apparatus 100 includes a fixture 120, a probe 130, a controller 140 and data acquisition system 150. The fixture 120 comprises a chuck support 122 and a probe mount 124. The chuck is secured to the chuck support by any suitable means such as bolts or a clamp. Two vertical posts 126A and 126B support the probe mount 124. A probe head 132 of the probe 130 is fixed to the probe mount 124 such that the probe head 132 is secured in a substantially fixed position relative to the chuck 110. The probe mount 124 maintains the probe head 132 at a fixed distance D from a surface 112 of the chuck 110. Preferably the distance D is between approximately 1–2 mm. The probe mount 124 allows for adjustment of the position of the probe head 132 to accommodate different sizes and shapes of the chuck 110 and for measuring performance parameters at different places on the chuck surface 112.

The probe head 132 is, for example, an electrostatic probe that measures an electrostatic surface potential at the surface 112 of the chuck 110. Signals from the probe head 132 are transmitted to a static electricity meter 134 for preprocessing such as amplification and filtering. The probe and meter are, for example, a Trek 344 electrostatic meter, manufactured by Trek, Inc. of Medina, N.Y. The meter 134 has an analog output 136 connected to an analog input 152 of the data acquisition system 150. The data acquisition system is, for example, an Omega Data Shuttle manufactured by Omega Engineering of Stamford, Conn. Signals representing surface potential measurements from the probe head are thus transferred to the data acquisition system 150 via the meter 134. The data acquisition system 150, in turn, processes these signals and transmits them to the controller 140. For example, the data acquisition system 150 includes an analog to digital (A/D) converter 153 and other support circuits 156 such as memory, clocks, power supplies, input and output (I/O) to carry out the necessary signal processing.

Any type of chuck 110 can be tested by the apparatus 100. The chuck 110 is typically fabricated from a dielectric material such as a polyimide or ceramic. The chuck retains a semiconductor wafer (not shown) on the support surface 112 during processing when the chuck 110 is in-situ (i.e., in the process chamber). The chuck 110 is, for example, a bipolar chuck that contains two chuck electrodes 114A and 114B. Although a bipolar chuck 110 having two electrodes 114A and 114B is depicted herein, the apparatus 100 can be used with a chuck 110 containing any number of chucking electrodes and any type of chucking electrode structure including monopolar, bipolar, tripolar, interdigitated, zonal and the like.

Voltages of opposite polarity are applied to the chuck electrodes 114A and 114B by a voltage power supply 160. A grounded center tap 162 of the voltage power supply 160 is connected to the meter 134 to provide a fixed voltage reference for the meter 134. The power supply 160 is coupled to the controller 140 via the data acquisition system 150 such that parameter measurements can be performed in response to an instruction from the controller 140. For example, a voltage can be applied to the chuck electrodes 114A and 114B. For example, a high voltage on/off switching device, such as a relay 164 operates a switch 166 that interrupts voltage to the chuck electrodes 114A and/or 114B. Although a double pole switch 166 is depicted in FIG. 1, a single pole or other suitable switch may be used in its place. The relay operates in response to a signal such as a programmable output 154 of the data acquisition system 150.

Figure 2:
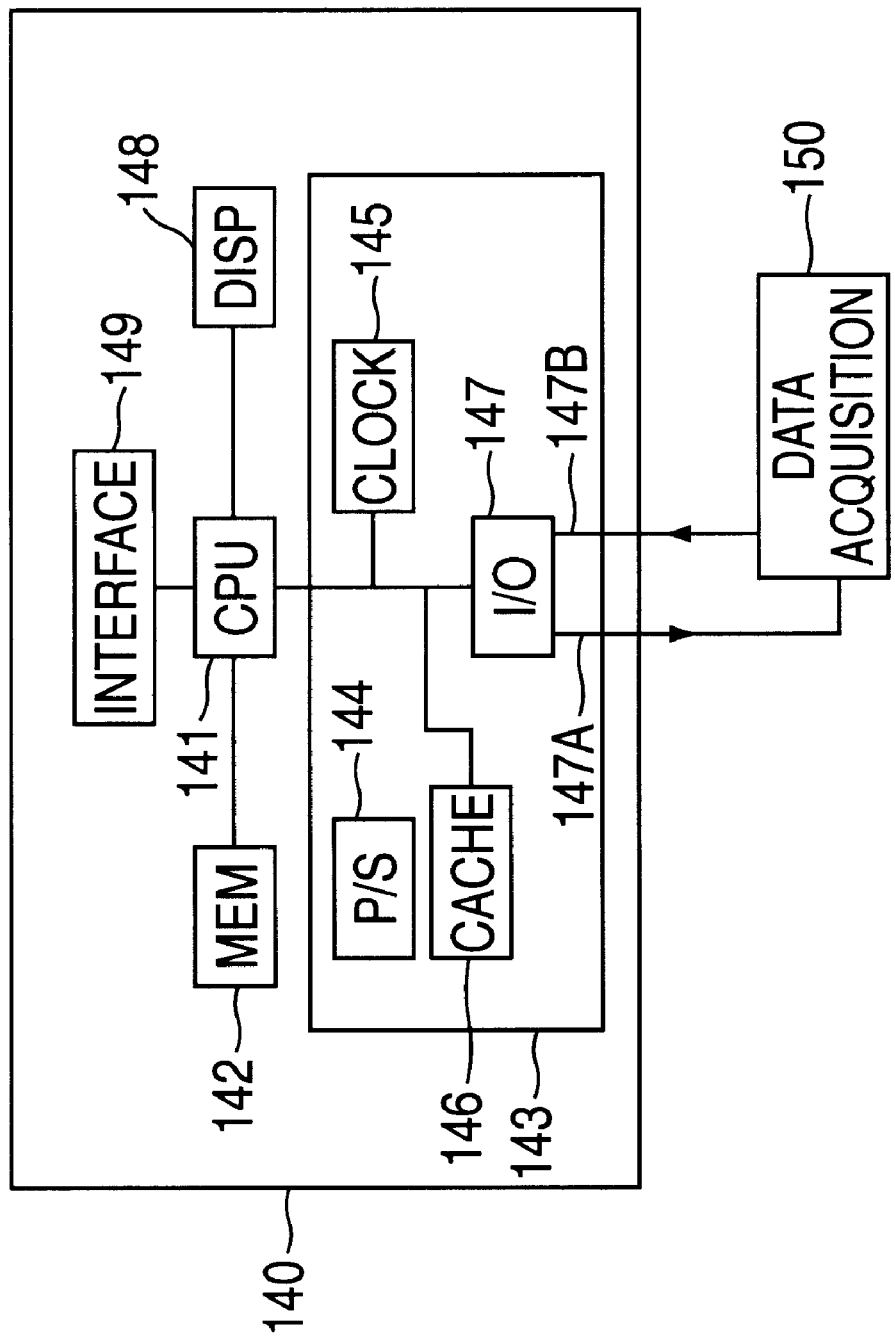
FIG. 2 depicts a block diagram of a system controller of the processing system in FIG. 1.

The controller 140 includes hardware to provide the necessary signals to initiate, monitor, regulate, and terminate ex-situ measurements of one or more performance parameters of the chuck. The details of the controller 140 are depicted in the block diagram of FIG. 2. The controller is, for example, a Pentium 90 manufactured by West Coast Peripherals of Fremont, Calif. Pentium is a trademark of Intel Corporation. The controller 140 includes a programmable central processing unit (CPU) 141 that is operable with a memory 142 (e.g., RAM, ROM, hard disk and/or removable storage) and well-known support circuits 143 such as power supplies 144, clocks 145, cache 146, input/output (I/O) circuits 147 and the like. More specifically, I/O circuits 147 produce control signals, such as a control output 147A, and receive signals such as an input 147B. By executing software stored in the memory 142, the controller 140 produces the control output 147A that controls the power relay 164 through the programmable output 154 of the data acquisition system. The controller receives signals at the input 147B from the static electricity meter via the analog input 152 and A/D converter 153 of the data acquisition system 150.

The controller 140 also includes at least one display device 148 that displays information in a form that can be readily understood by a human operator. The controller further includes at least one user interface 149 that sends information from the operator to the controller 140 in a form that can be readily interpreted by the controller 140. The display device 148 is, for example, a cathode ray tube (CRT) monitor. The user interface 149 is, for example, a keyboard or mouse. Alternatively, the display 148 and user interface 149 may be combined in a graphical display that portrays system parameters and control icons upon a "touch screen" or light pen based interface.

The steps of the method of the present invention could be implemented by a suitable computer program running on the CPU 141 of the controller 140. The CPU 141 forms a general purpose computer that becomes a specific purpose computer when executing programs such as the program 300 of the embodiment of the method of the present invention depicted in the flow diagram of FIG. 3. Although the invention is described herein as being implemented in software and executed upon a general purpose computer, those skilled in the art will realize that the invention could be implemented using hardware such as an application specific integrated circuit (ASIC) or other hardware circuitry. As such, it should be understood that the invention can be implemented, in whole or in part, in software, hardware or both.

Figure 3:
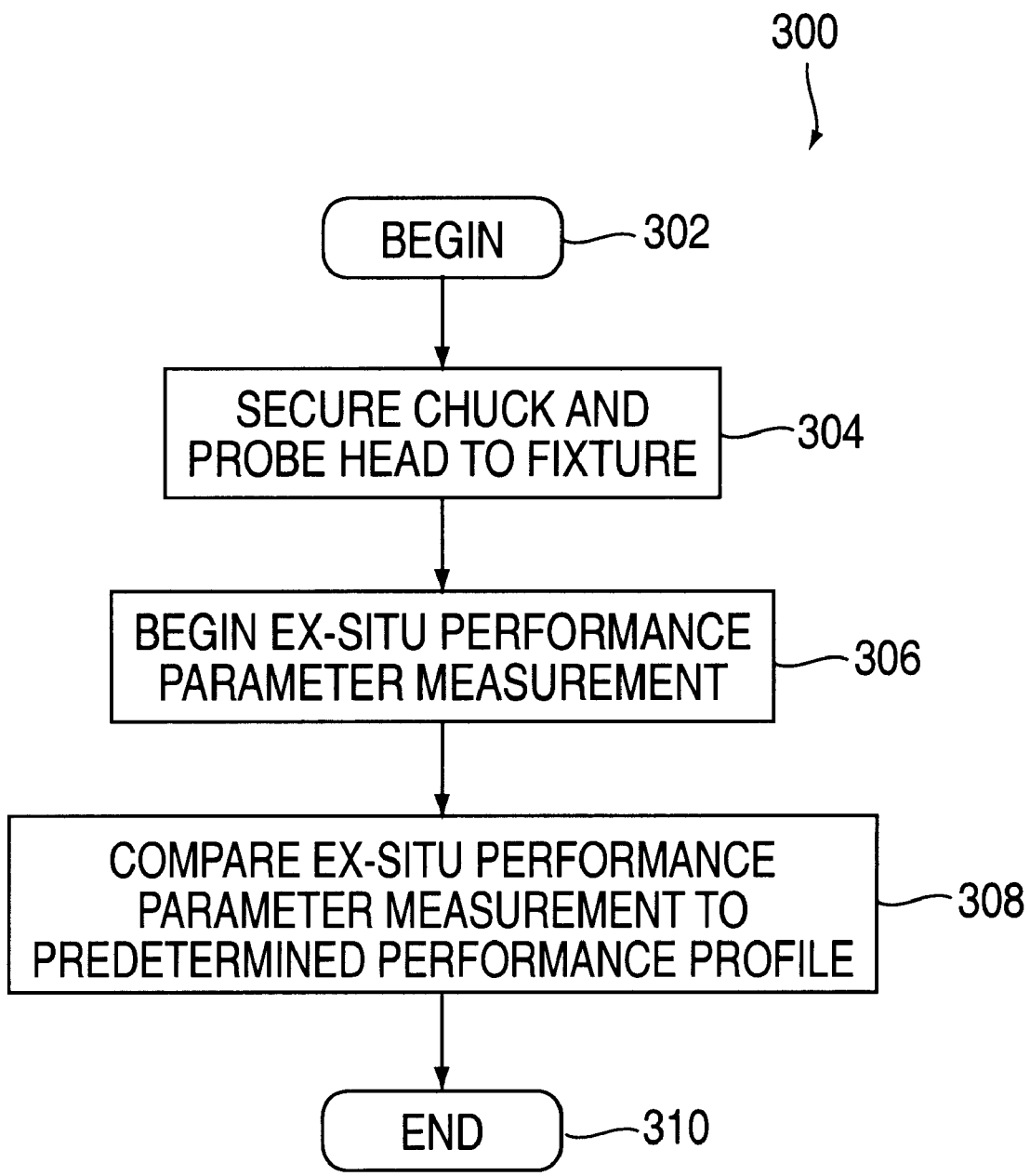
FIG. 3 depicts a flow diagram of the method of the present invention.

Those skilled in the art would be readily able to devise a computer program such as a program 300 depicted in the flow diagram of FIG. 3. The program 300 is suitable for monitoring and controlling an ex-situ measurement of a performance parameter of an electrostatic chuck. Although the program 300 is described herein with respect to a surface potential measurement, those skilled in the art will recognize that the method of the present invention can be applied to any ex-situ parameter such as electric field strength or electric field density.

The method of the present invention begins at step 302 and continues to step 304 where a chuck 110 and probe head 132 are secured to the fixture 120. For example the program 300 executes a first set of instructions that cause a prompt to appear at the display device 148 that reminds the operator to secure the probe head 132 and the chuck 110 to the fixture 120. Experimental parameters such as the chuck type, chuck voltage, time and date of the experiment can also be entered by the operator at this time.

Next, in step 306, ex-situ performance parameter measurement of the chuck begins. For example, the program 300 executes a second set of instructions that processes timing signals from the clock and surface potential signals from the probe head so that surface potential $\Phi$ can be measured as a function of time t. Time and voltage measurements can be stored, for example in an array $\Phi(t)$. After a first predetermined amount of time T1, a third set of instructions cause the control output to the data acquisition system 150 to energize the relay 164 thereby closing switch 166 causing the power supply 160 to apply a chucking voltage to the chuck electrodes 114A and/or 114B. After a second predetermined amount of time T2, a fourth set of instructions causes the control output to supply a signal to the data acquisition system 150 that turns off the relay 164 thereby interrupting the voltage applied to the chuck electrodes 114A and/or 114B. After a third predetermined amount of time T3, a fifth set of instructions signals the processor 141 to stop recording data and the measurement step 306 concludes. Predetermined times T1 and T2 can be part of the program 300 or they may be entered by the operator prior to step 306. Alternatively, application of chuck voltage and/or the starting and stopping of measurement in step 306 can be controlled at the operator's discretion via the interface 149. Although, in this example, the chucking voltage is turned on once and turned off once, the chucking voltage may be cycled on and off any number of times.

The measured performance parameter is then compared to a predetermined performance profile in step 308. For example, an ex-situ measurement of the chuck surface potential as a function of time can be compared to a standard profile of chuck voltage versus time for a known in-situ chuck performance. The predetermined in-situ performance profile can be stored in the memory 142 of the controller 140 in an array P(t). Specifically, a sixth set of instructions calculates a correlation parameter C that quantifies the comparison between the array $\Phi(t)$ and the array P(t) according to a suitable correlation algorithm. Alternatively, a seventh set of instructions displays the arrays $\Phi(t)$ and P(t) on the display as graphs for visual comparison by the operator. After the measured performance parameter has been compared to the predetermined performance profile, the method ends at step 310.

Figure 4:
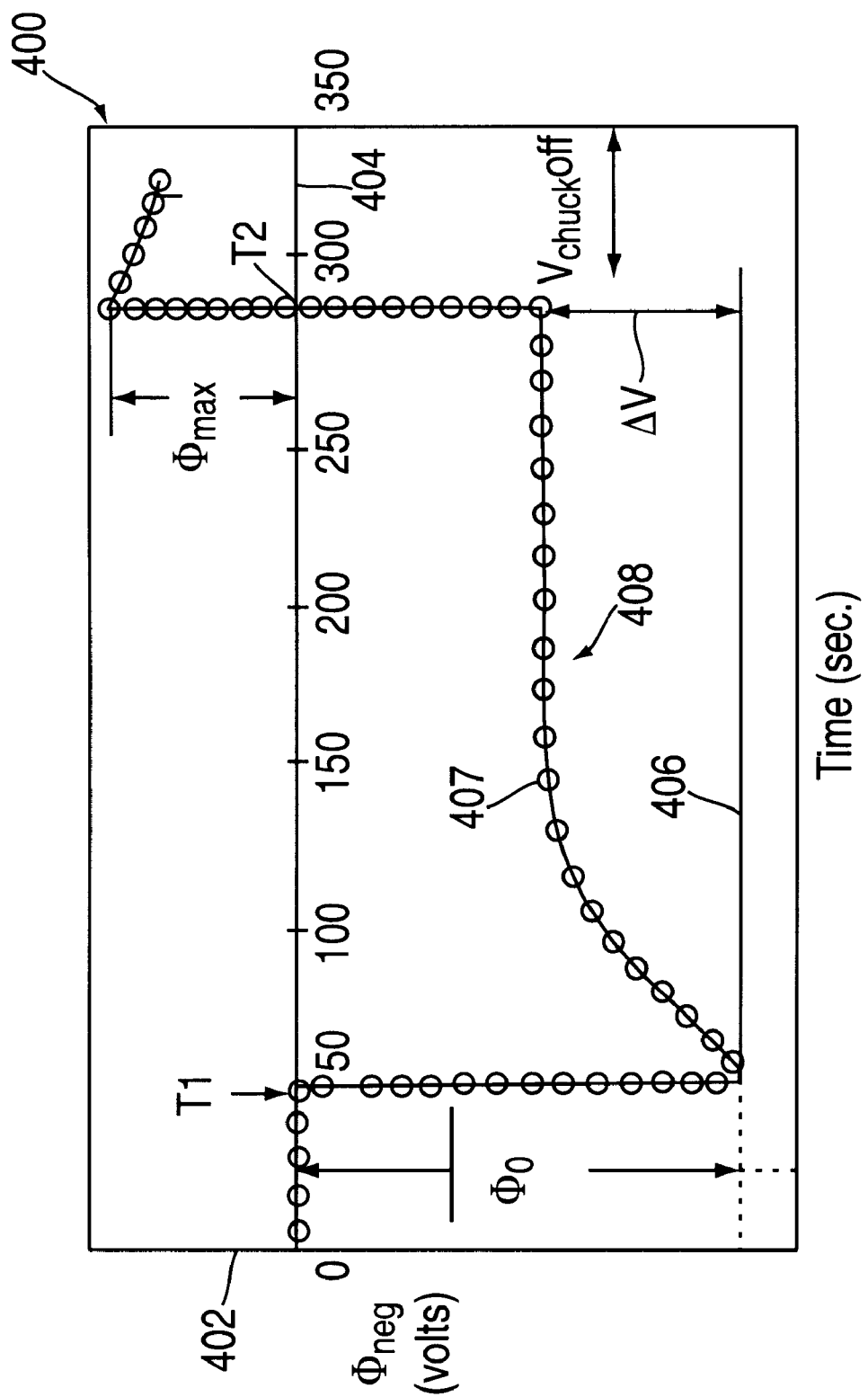
FIG. 4 depicts a typical data trace taken with the ex-situ measurement apparatus of the present invention.

An example of a comparison of an ex-situ performance parameter measurement to a standard in-situ performance profile is depicted in FIG. 4. A graph 400 has a vertical axis 402 representing the surface potential $\Phi_{neg}$ (measured in volts) proximate a negative electrode such as electrode 114A of an electrostatic chuck such as chuck 110. Time t (measured in seconds) is plotted along a horizontal axis 404. The solid line plot 406 shows the predetermined performance (i.e., surface potential) profile. The plot 408 indicated by the circles 407 shows the ex-situ parameter (i.e., surface potential) measurement.

Both plots 406 and 408 show a surface potential of approximately zero corresponding to a zero chucking voltage applied to the monitored electrode 114A. At a first predetermined time T1, a negative voltage is applied to the chuck electrode 114A. Both plots rapidly fell to a negative value $\Phi_o$ of the surface potential $\Phi$. Ideally, the profile of surface potential $\Phi$ should remain fixed at $\Phi_o$ while the chuck voltage is maintained as shown by the plot 406. The measured surface potential, however, degraded (i.e., became less negative) over time as shown by the plot 408. Eventually, the measured surface potential leveled off at a value that differed from $\Phi_o$ by an amount $\Delta V$. Such a degradation of the surface potential corresponds to a degradation in the chucking force produced by the chuck 110.

After a second predetermined amount of time T2 has elapsed, voltage applied to the electrode 114A was turned off. Ideally, the surface potential profile $\Phi$ should rapidly go to zero as shown in the plot 406. However, the measured potential actually overshot the predetermined profile by an amount $\Phi_{max}$ and subsequently decayed as shown by the plot 408. Such an overshoot of the surface potential can cause a reversal of the chucking force from an attractive force to a repelling force that can dislodge a wafer from the chuck. In a preferred embodiment of the subject method T1 is 60 seconds, T2 is 300 seconds, the chucking voltage is ±125 volts.

The difference $\Delta V$ or overshoot $\Phi_{max}$ can easily be calculated by a suitable set of instructions within the program 300. The value of $\Delta V$ or $\Phi_{max}$ (or calculations based on either or both of them) can serve as the correlation parameter C. A value of C outside of predetermined acceptable limits warns the operator that the chuck being tested is unsuitable for in-situ operation.

The present invention could be practiced without the controller 140. For example, the data acquisition system 150 could include a display device 148 such as a storage oscilloscope, pen plotter or strip chart recorder directly coupled to the probe head 132 and/or static electricity meter 134. A plot from the display device 148 such as plot 408 could then be readily compared to a predetermined performance profile such as plot 406.

Those skilled in the art can readily devise other variations of the apparatus and method of the present invention described herein. For example, the probe head 132 can be movably mounted to the fixture 120 such that performance parameter measurements can be made while scanning the probe head 132 across the chuck surface 112. Alternatively, the relay 164 could be replaced with suitable circuitry that allows the power supply 160 to continuously adjust and measure the voltage applied to the chuck electrodes 114A and 114B. Thus, performance parameters such as surface potential could be measured as a function of the voltage applied to the chuck electrodes 114A and 114B.

The apparatus and method of the present invention provide for ex-situ measurements that detect problems associated with an electrostatic chuck. The ex-situ measurements can be performed on a bench-top or other controlled laboratory environment before the chuck is installed in a process chamber. Thus, the apparatus and method provide for quality control of electrostatic chucks ex-situ. Furthermore, the apparatus and method of the present invention can be applied to ex-situ failure analysis of chucks that exhibit unacceptable performance in-situ.

Although various embodiments which incorporate the teachings of the present invention have been shown and described in detail herein, those skilled in the art can readily devise many other varied embodiments that still incorporate these teachings.

What is claimed is:

1. Apparatus for ex-situ testing of performance parameters on an electrostatic chuck, comprising:
   a probe for collecting a plurality of time-based data points;

a fixture for securing said probe relative to the electrostatic chuck; and a data acquisition system coupled to said probe wherein, the data acquisition system acquires the time-based data points and generates a correlation parameter.

2. The apparatus of claim 1 wherein said probe comprises a probe head coupled to a meter.

3. The apparatus of claim 2 wherein said meter is an electrostatic meter.

4. The apparatus of claim 1 wherein said probe measures an electrostatic surface potential of said electrostatic chuck.

5. The apparatus of claim 1 wherein said fixture comprises a probe mount supported by two vertical posts.

6. The apparatus of claim 1 further comprising:

a controller coupled to said data acquisition system.

7. The apparatus of claim 1 further comprising a voltage power supply and a relay, wherein said relay couples said voltage power supply to said data acquisition system.

8. The apparatus set forth in claim 1, wherein the probe is spaced from the electrostatic chuck when the probe is secured in the substantially fixed position.

9. Apparatus for ex-situ testing of performance parameters on an electrostatic chuck, comprising:

a probe having a probe head and a meter for collecting a plurality of time-based data points;

a fixture for securing said probe relative to the electrostatic chuck;

a data acquisition system coupled to said probe; and a system controller coupled to said data acquisition system;

wherein, the data acquisition system acquires the time-based data points and generates a correlation parameter.

10. The apparatus of claim 9 wherein said probe measures an electrostatic surface potential of the electrostatic chuck.

11. The apparatus of claim 9 further comprising a voltage power supply and a relay, wherein said relay couples said voltage power supply to said data acquisition system.

12. The apparatus of claim 9 wherein said power supply is coupled to said data acquisition system.

13. The apparatus set forth in claim 9, wherein the probe is spaced from the electrostatic chuck when the probe is secured in the substantially fixed position.

14. A method for measuring a time-based performance parameter of an electrostatic chuck ex-situ, having one or more electrodes, in an apparatus comprising a probe for collecting a plurality of time-based data points, a fixture, and a data acquisition system coupled to said probe, said method comprising the steps of:

securably positioning said probe relative to said electrostatic chuck;

measuring a plurality of time-based data points ex-situ; and comparing said time-based data points to a predetermined in-situ performance profile.

15. The method of claim 14 wherein said measuring step further comprises changing a voltage applied to said one or more electrodes.

16. The method of claim 14 wherein said comparing step comprises calculating a correlation parameter.

17. The method of claim 14 wherein said measured ex-situ performance parameter is a surface potential of said electrostatic chuck.

18. The method of claim 17 wherein said surface potential is measured as a function of time.

19. The method of claim 18 wherein said in-situ performance profile represents an ideal surface potential of said electrostatic chuck as a function of time.

20. The method of claim 17 wherein said comparing step comprises plotting said surface potential as a function of time.

21. The method set forth in claim 14, wherein the probe is spaced from the electrostatic chuck during the securably positioning step.

22. A computer readable storage medium having program code embodied therein, said program code comprising steps for performing the measurement of a performance parameter of an electrostatic chuck secured to a measurement apparatus, wherein said apparatus includes a probe, a fixture, a data acquisition system coupled to said probe, and a controller coupled to said data acquisition system, said program code performing the following steps:

(a) prompting an operator to secure said electrostatic chuck and said probe relative to said fixture;

(b) measuring a performance parameter ex-situ when the probe and the electrostatic chuck are secured relative to the fixture; and (c) comparing said measured performance parameter to a predetermined in-situ performance profile.

23. The method set forth in claim 22, wherein the probe is spaced from the electrostatic chuck during the measuring step.

* * * * *